United States Patent
Lu et al.

(10) Patent No.: US 6,730,597 B1
(45) Date of Patent: May 4, 2004

(54) PRE-ECD WET SURFACE MODIFICATION TO IMPROVE WETTABILITY AND REDUCED VOID DEFECT

(75) Inventors: Jiong-Ping Lu, Richardson, TX (US); Linlin Chen, Plano, TX (US); David Gonzalez, Jr., Plano, TX (US); Honglin Guo, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/667,403

(22) Filed: Sep. 21, 2000

Related U.S. Application Data
(60) Provisional application No. 60/222,774, filed on Aug. 3, 2000.

(51) Int. Cl.$^7$ .................................................. H01L 21/44
(52) U.S. Cl. ...................................... 438/677; 438/678
(58) Field of Search ......................... 438/618, 620, 438/622, 624, 628, 629, 631, 633, 653, 654, 663, 679, 677, 687, 688, 700

(56) References Cited

U.S. PATENT DOCUMENTS

| | | | | |
|---|---|---|---|---|
| 6,037,258 A | * | 3/2000 | Liu et al. | 438/987 |
| 6,068,000 A | * | 5/2000 | Tanabe et al. | 134/1.3 |
| 6,078,717 A | * | 6/2000 | Nahimoto et al. | 385/130 |
| 6,120,641 A | * | 9/2000 | Stevens et al. | 156/354 |
| 6,123,825 A | * | 9/2000 | Uzoh et al. | 205/183 |
| 6,129,091 A | * | 10/2000 | Lee et al. | 134/3 |
| 6,136,680 A | * | 10/2000 | Lai et al. | 438/597 |
| 6,224,737 B1 | * | 5/2001 | Tsai et al. | 205/123 |
| 6,258,220 B1 | * | 7/2001 | Dordi et al. | 204/198 |
| 6,284,652 B1 | * | 9/2001 | Charneski et al. | 438/653 |

* cited by examiner

*Primary Examiner*—W. David Coleman
*Assistant Examiner*—Brook Kebede
(74) *Attorney, Agent, or Firm*—Jacqueline J. Garner; W. James Brady III; Frederick J. Telecky, Jr.

(57) ABSTRACT

A pre-ECD wet surface treatment. After forming the barrier material (110) and seed layer (112), the surface of the seed layer (112) is treated with a water-based solution to remove surface contamination (122) and improve wettability. The ECD copper film (124) is then formed over the seed layer (112).

17 Claims, 3 Drawing Sheets

PRE-ECD WET SURFACE MODIFICATION TO IMPROVE WETTABILITY AND REDUCED VOID DEFECT

This application claims priority under 35 USC § 119(e)(1) of provisional application No. 60/222,774 filed Aug. 03, 2000.

FIELD OF THE INVENTION

The invention is generally related to the field of fabricating copper interconnects in semiconductor devices and more specifically to a pre-copper deposition wet surface treatment.

BACKGROUND OF THE INVENTION

As the density of semiconductor devices increases, the demands on interconnect layers for connecting the semiconductor devices to each other also increases. Therefore, there is a desire to switch from the traditional aluminum metal interconnects to copper interconnects. Unfortunately, suitable copper etches for a semiconductor fabrication environment are not readily available. To overcome the copper etch problem, damascene processes have been developed.

In a conventional interconnect process, the aluminum (and any barrier metals) are deposited, patterned, and etched to form the interconnect lines. Then, an interlevel dielectric (ILD) is deposited and planarized. In a damascene process, the ILD is formed first. The ILD is then patterned and etched. The barrier material is then deposited over the structure with the copper being formed over the barrier material. Then, the copper and barrier material are chemically-mechanically polished to remove the material from over the ILD, leaving metal interconnect lines. A metal etch is thereby avoided.

The most practical technique for forming copper interconnects is electrochemical deposition (ECD). In this process, after the barrier material is deposited, a seed layer of copper is deposited. Then, ECD is used to deposit copper over the seed layer. ECD is a process used to produce a solid phase product (such as thin films) by electrochemical reaction. Cu ECD is a process used to make Cu thin films through electrochemical reduction of Cu ion, represented by the following chemical equation:

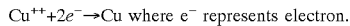

$Cu^{++} + 2e^- \rightarrow Cu$ where $e^-$ represents electron.

In order for the ECD process to proceed, a seed layer is required to pass current and to serve as a nucleation layer. The wettability of the seed surface is very critical for the ECD process. If a seed surface cannot wet the plating solution, no Cu can be deposited on that surface area, forming a void. Proper control of the bath composition allows the ECD process to be carried out in a bottom-up mode (i.e., film preferentially grows from the bottom of small features to avoid seams or fill voids). This feature makes ECD preferable over other copper fill processes.

One of the problems with ECD copper films is that the films frequently show defects of deep voids. The deep voids have characteristic swirl marks across a wafer as shown in FIG. 1. This swirl defect is known to appear and disappear in an uncontrolled pattern. This causes wide lot-to-lot variations. Accordingly, a better understanding of the factors contributing to the ECD defects and a solution for reducing or eliminating the defects are desired.

SUMMARY OF THE INVENTION

The invention is a pre-ECD wet surface treatment. After forming the barrier material and seed layer, the surface of the seed layer is treated with a water-based solution to improve surface wettability. The ECD copper film is then formed over the seed layer.

An advantage of the invention is providing a stable manufacturing process for ECD of copper films.

This and other advantages will be apparent to those of ordinary skill in the art having reference to the specification in conjunction with the drawings.

DETAILED DESCRIPTION OF THE EMBODIMENTS

Figure 1:
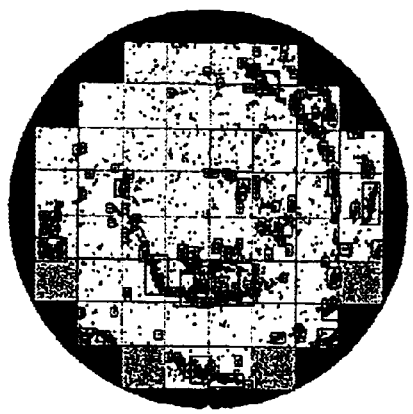
FIG. 1 is a top view of a prior art wafer having the swirl defect characteristic of an ECD copper process.

One of the major areas of concern in forming copper interconnects is the lot-to-lot variation in copper ECD defects. While investigating the factors contributing to ECD defects, the inventors noticed that the age of the seed layer appeared to be a factor. Some lots with a long seed age (~3 days) showed high defect density and swirl marks. However, qualification wafers stored in a vendor box showed low defect density after several weeks.

Experiment #1

After seed layer deposition, wafers of one lot were divided into three groups:
1: stored in a clear vendor box
2: stored in a cassette on a wire rack (TFOP1–3) in a Barrier/Seed Deposition clean room area
3: stored in a cassette on a wire rack (CMPCU-3) in an ECD/CMP clean room area.

After aging the wafers either 6 or 11 days, copper ECD was performed. The 6-step ECD recipe consisted of: (1) 15 seconds at a plating current of 0.75 amps; (2) 24 seconds at a plating current of 3 amps; (3) 1.5 seconds at a reverse current of –6 amps; (4) 20 seconds at a plating current of 4 amps; (5) 1.5 seconds at a reverse current of –6 amps; and (6) final plating at 18 amps until the final desired thickness is achieved. The 3-step ECD recipe consisted of: (1) 15 seconds at a plating current of 0.75 amps; (2) 60 seconds at a plating current of 3 Amps; and (3) final plating at 7.5 Amps until the final desired thickness is achieved. Table I shows the surface defectivity (as measured by a SP1 defect inspection tool from KLA Corporation) for the various wafers.

TABLE I

| Wafer # | Stored in | Age (days) | Plating Tool | ECD recipe | SP1 (defectivity) |
|---|---|---|---|---|---|
| 1 | TFOP1-3 | 6 | CH10C-1 | 6 step | 164 |
| 2 | CMPCU-3 | 6 | CH10C-1 | 6 step | 93 |
| 3 | Clear box | 6 | CH10C-1 | 6 step | 56 |
| 13 | TFOP1-3 | 6 | CH10C-1 | 6 step | 153 |

TABLE I-continued

| Wafer # | Stored in | Age (days) | Plating Tool | ECD recipe | SP1 (defectivity) |
|---|---|---|---|---|---|
| 14 | CMPCU-3 | 6 | CH10C-1 | 6 step | 150 |
| 15 | Clear box | 6 | CH10C-1 | 6 step | 37 |
| 5 | TFOP1-3 | 11 | CH08C-2 | 3 step | 173 |
| 6 | CMPCU-3 | 11 | CH08C-2 | 3 step | 150 |
| 7 | Clear box | 11 | CH08C-2 | 3 step | 45 |

The above results showed that the "observed seed age effect" was not actually due to the age of the seed layer. Wafers stored in the vendor clear boxes did not show significant defects, while wafers exposed to the fab ambient had high defect counts after aging. It is the surface condition of the copper seed layer that affects the defect count.

In order to better understand the surface condition of the exposed and boxed wafers, XPS and TOF-SIMS were performed in the two different types of wafers. XPS results indicated a higher level of hydrocarbon component on the exposed seed wafer surface. The carbon (1 s)/copper (2p) peak ratio for the exposed wafers is 1.7 times that of the boxed wafers. TOF-SIMS analysis showed a higher level of organic fragments on the surface of the seed layer. Surface characterization showed that organic contamination was the main contributing factor to the "observed seed age effect." The contamination degrades the wetting property of the seed surface and increases the defect counts of the ECD films.

Embodiments of the Invention

Figure 2A:
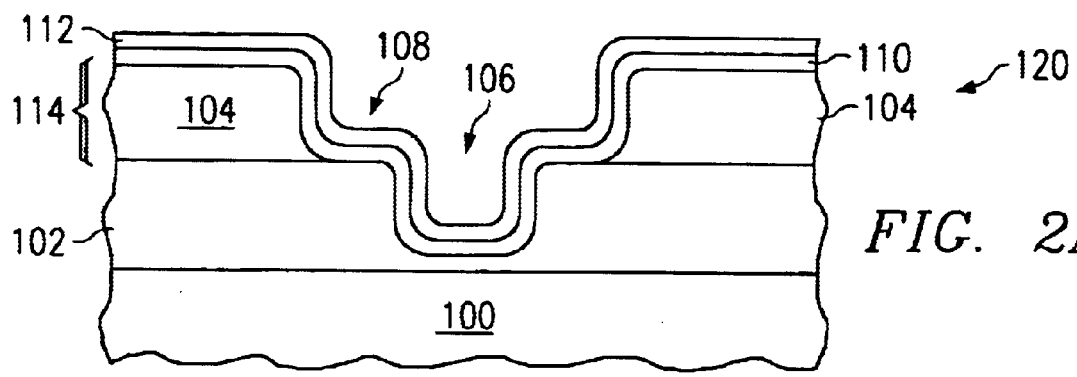
FIGS. 2A–2C are cross-sectional drawings of a copper interconnect structure formed according to the invention.
Figure 2B:
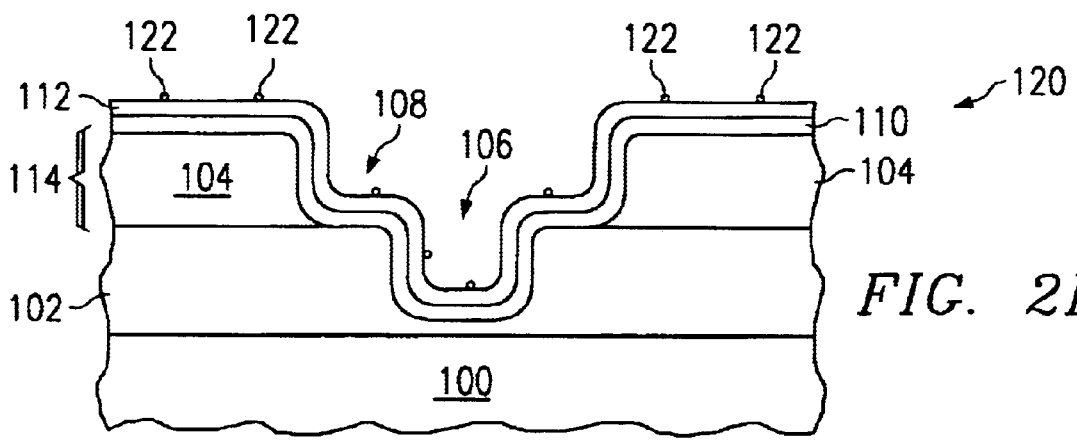

Embodiments of the invention will now be discussed with reference to FIGS. 2A–2C. A semiconductor body 100 is processed through formation of the seed layer 112. Semiconductor body 100 typically comprises a silicon substrate having transistors and other elements formed therein. Seed layer 112 is part of a copper interconnect level 114. Copper interconnect level 114 may be the first or any subsequent metal interconnect level of the semiconductor device 120.

An ILD 102 is formed over semiconductor body 100. IMD 104 is formed over ILD 102. An etchstop layer (not shown) may optionally be placed between ILD 102 and IMD 104. Suitable dielectrics for ILD 102 and IMD 104, such as silicon dioxides, fluorine-doped silicate glass (FSG), organo-silicate glass (OSG), hydrogen silesquioxane (HSQ), and combinations thereof, are known in the art.

A via 106 is etched in ILD 102 and a trench 108 is etched in IMD 104. Via 106 is used to connect to underlying metal interconnect layers. Trench 108 is used to form the metal interconnect layer.

Barrier layer 110 is deposited over IMD 104 including in trench 108 and via 106. Barrier layer 110 functions to prevent copper diffusion into the ILD and IMD layers. Suitable barrier materials such as Ta/TaN are known in the art. Seed layer 112 is deposited over barrier layer 110.

The time between the formation of the seed layer 112 and copper ECD can vary for a variety of reasons. Typically, wafers are stored in a cassette after the formation of seed layer 112. As time passes, the surface conditions of the seed layer 112 degrade as organic contaminants 122 deposit on the surface. The result is shown in FIG. 2B.

In order to remove the surface contaminants and improve the wetting characteristics of the seed surface, a wet treatment (e.g., rinsing with a water- based solution) is performed on the surface of seed layer 116 prior to copper ECD. As an example, de-ionized (DI) water may be used to rinse the wafers followed by an optional $N_2$ dry or spin dry step. Alternatively, a combined isopropanol alcohol (IPA)/DI water rinse may be used with an optional $N_2$ dry or spin dry step. Drying is optional, but preferred to avoid any potential trapping of water before plating starts. Alternative rinsing solutions include acetone/DI-water, methonal (methyl alcohol)/DI-water, ethonal (ethyl alcohol)/DI-water, acetic acid/DI-water and other aqueous solutions that can improve the surface wettability without leaving undesirable residue.

The water-based rinse may be performed in the ECD plating cell, another cell in the plating cluster tool, or a separate tool. Table II shows the effects of pre-rinsing in the ECD plating cell.

TABLE II

| Wafer # | Pre-rinse? | SP1 count | Swirl Mark? | Rs | NU % | Range |
|---|---|---|---|---|---|---|
| 8 | 2 sec | 20 | no | 17.5 | 2.7 | 1246 |
| 9 | no | 255 | yes | 17.6 | 3.0 | 945 |
| 12 | 1 sec | 26 | no | 17.5 | 3.2 | 1288 |
| 13 | no | 391 | yes | 17.6 | 2.9 | 1014 |

Figure 3A:
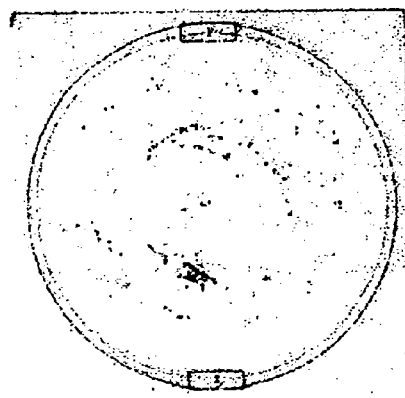
FIGS. 3A–3B are defect maps from a top view of a semiconductor wafer without and with a pre-ECD wet surface treatment, respectively.
Figure 3B:
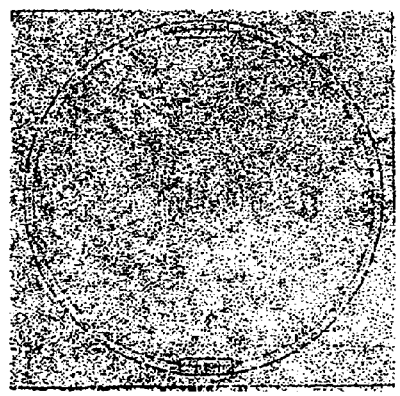

As Table II shows, the in-situ pre-rinse is effective in reducing defect counts even when the duration is as short as 1 sec. The sheet resistance, $R_s$, measurements indicated no adverse effect of pre-rinse on film uniformity is expected. FIG. 3A and 3B show a defect map of a wafer that was not pre-rinsed and a wafer having a 1 sec pre-rinse, respectively. The swirl defect pattern is eliminated by a 1 sec pre-rinse.

Table III shows the effect of pre-rinsing in a separate cell (e.g., the spin-rinse-dry (SRD) cell) on the ECD plating tool.

TABLE III

| Wafer # | Pre-rinse? | SP1 | Swirl |
|---|---|---|---|
| 12 | 3 sec | 62 | no |
| 13 | no | 178 | yes |
| 14 | 3 sec | 83 | no |
| 16 | 5 sec | 57 | no |
| 17 | no | 184 | yes |
| 18 | no | 151 | yes |
| 19 | 10 sec | 47 | no |

Figure 2C:
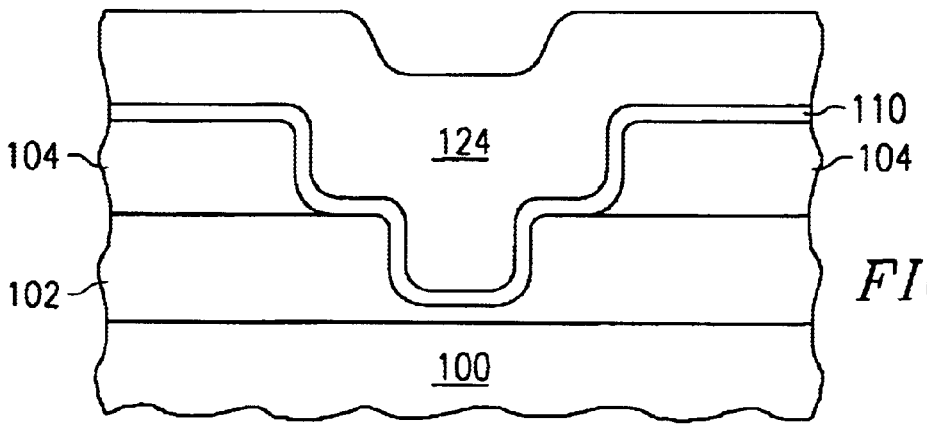

After pre-rinsing, copper ECD is performed as shown in FIG. 2C to form copper layer 124. In a first embodiment of the invention, the pre-rinse and optional spin drying are performed in the plating cell of the ECD tool immediately before the wafer is immersed in the plating solution. The duration of the pre-rinse is in the range of 1–5 seconds. The optional spin dry has a duration in the range of 1–10 seconds. The desired ECD process is then performed. Various copper ECD processes are known in the art. In one example, a 3-step process is used. After placing the wafer in the plating solution, a current of approximately 0.75 Amps is passed through the seed layer 112 for a time on the order of 15 secs. The current is then increased to around 3 Amps for approximately 60 seconds. Final plating occurs at a current of about 7.5 Amps with the duration determined by the final desired thickness. A quick spin-rinse dry (SRD) is performed in the plating cell above the plating solution. The wafer is then transferred to the SRD cell and a post-ECD SRD is used to clean the plating residue.

In a second embodiment of the invention, the pre-rinse and optional spin-dry are performed in a separate cell of the ECD cluster tool. For example, the SRD cell may be used. In this embodiment, the duration of the rinse may be in the range of 1–15 seconds and the optional spin-dry may have a duration in the range of 5–30 seconds. The wafer is then moved to the plating cell and the ECD process is performed. The rinsing step is performed as close in time to the ECD step as practical.

In a third embodiment of the invention, the pre-rinse and optional spin-dry are performed in a separate tool. In this embodiment, the duration of the rinse may be in the range of 1–15 seconds and the optional spin-dry may have a duration in the range of 5–30 seconds. The wafer is then moved to the plating cell and the ECD process is performed.

After copper ECD, the copper 124 and barrier 110 are chemically mechanically polished (CMP) to remove the material from above IMD 104. Processing may then continue to form additional metal interconnect levels and package the device.

Experimental Results

Contact angle was measured as an indication of surface condition. When a surface is contaminated with organic species, it normally degrades the surface wettability towards the water or aqueous solution. (The plating solution is aqueous.) This is due to the fact that water molecules are polar while most organic molecules are non-polar. The molecular interaction between water and surface is reduced by the organic contamination. As indicated below, the contact angle significantly decreased when a pre-rinse is used as compared to the rack-stored wafer. Pre-ECD wet treatment modifies the surface condition by removing organic contamination and/or forming a hydrated layer that allows better wettability towards the plating solution.

| Wafer | Contact Angle |
|---|---|
| Rack stored wafer | 65 |
| Box stored wafer | 34 |
| Rack stored wafer, followed by DI-water rinse and $N_2$ dry | 22 |
| Rack stored wafer, followed by IPA/DI-water rinse and $N_2$ dry | 21 |

Figure 4:
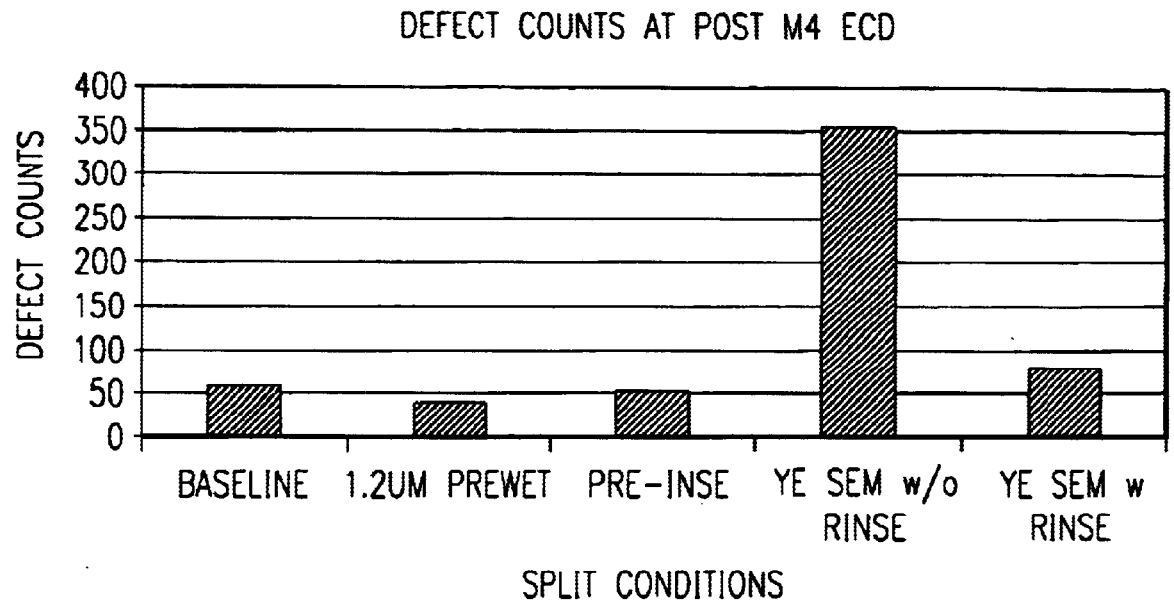
FIG. 4 is a graph of defect counts at post metal-4 ECD.

FIG. 4 is a graph comparing the defect counts at post M4 ECD (fourth metal interconnect level after copper ECD). In the graph, PRE-WET refers to pre-rinsing in the plating cell and PRE-RINSE refers to pre-rinsing in the SRD cell. The baseline split was plated within 24 hours after seed deposition, while the pre-rinse splits were plated 2.5 days after seed deposition. In spite of the additional exposure to fab ambient, the pre-rinsed splits performed better than the baseline split.

In a device flow, a step to inspect wafers with scanning electron microscope (SEM) after barrier/seed deposition is very valuable in learning factors affecting device yield. However, SEM inspection leaves organic contamination on the seed surface. Prior to this invention, the SEM inspection created void defects that degraded device yield. With pre-ECD surface modification according to the invention, the surface contamination effect by SEM inspection can be minimized, as shown in FIG. 4. These results demonstrated the advantages of the pre-ECD wet surface modification in both yield improvements and yield learning for device fabrication.

Figure 5:
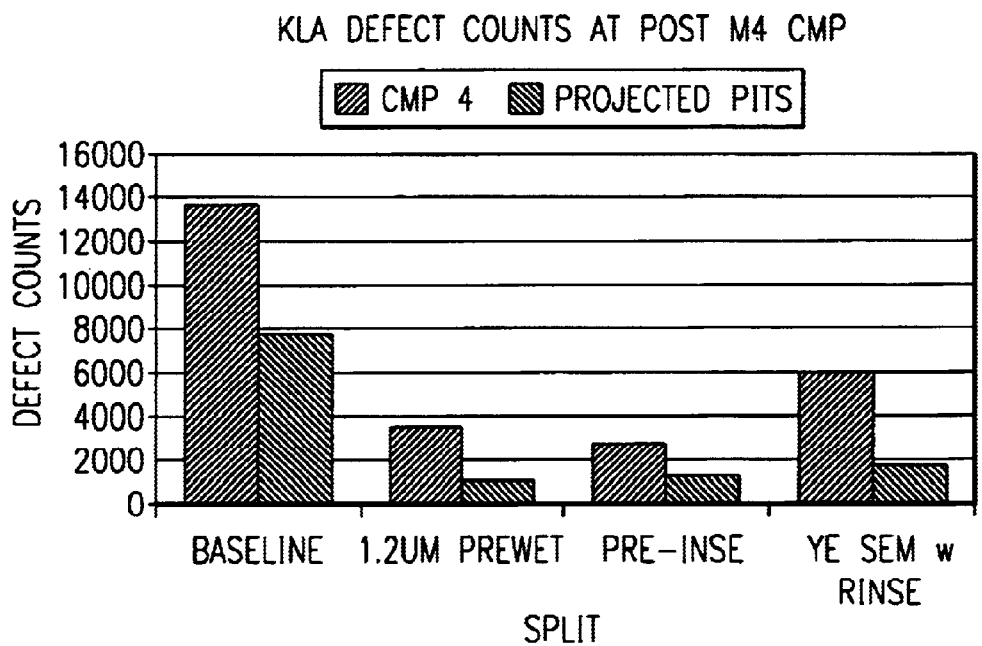
FIG. 5 is a graph of defect counts at post metal-4 CMP.

FIG. 5 is a graph of defect counts at post M4 CMP (after CMP of the fourth metal interconnect level). Both defect count and projected pits are greatly reduced by a pre-rinse. The pre-ECD wet surface treatment of the invention significantly reduces the lot-to-lot variations and killer defects. The swirl effect and seed aging effect are effectively eliminated. It is simple to implement in a production environment.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of fabricating an integrated circuit, comprising the steps of:
    forming a seed layer over a semiconductor body;
    performing a wet surface treatment on said seed layer, wherein said step of performing a wet surface treatment comprises the step of rinsing said seed layer with an aqueous solution comprising a solution selected from the group consisting of isopropyl alcohol and de-ionized (DI)-water, acetone and DI-water, methyl alcohol and DI-water, ethyl alcohol and DI-water, and acetic acid and DI-water; and
    after performing said wet surface treatment, depositing a copper layer on said seed layer using electrochemical deposition (ECD).

2. The method of claim 1, wherein said step of performing a wet surface treatment occurs in a plating cell of an ECD tool.

3. The method of claim 2, wherein said step of performing a wet surface treatment comprises the step of rinsing said seed layer with a water-based solution for a duration in the range of 1–5 seconds.

4. The method of claim 1, wherein said step of performing a wet surface treatment occurs in a cell separate from a plating cell of an ECD tool.

5. The method of claim 4, wherein said step of performing a wet surface treatment comprises the step of rinsing said seed layer with a water-based solution for a duration in the range of 1–15 seconds.

6. The method of claim 1, wherein said step of performing a wet surface treatment occurs in a tool separate from an ECD tool used to deposit said copper layer.

7. The method of claim 6, wherein said step of performing a wet surface treatment comprises the step of rinsing said seed layer with a water-based solution for a duration in the range of 1–15 seconds.

8. The method of claim 1, wherein the step of performing a wet surface treatment further comprises the step of spin-drying said seed layer after said rinsing step.

9. The method of claim 1, wherein said aqueous solution comprises de-ionized water.

10. The method of claim 1, wherein the step of performing a wet surface treatment further comprises the step of drying said seed layer with $N_2$.

11. A method of fabricating a copper interconnect for an integrated circuit comprising the steps of:
    providing a semiconductor body having a dielectric layer with a trench formed therein;
    forming a barrier layer over said dielectric layer including within said trench;
    forming a seed layer over said barrier layer;
    rinsing said seed layer with a water-based solution, wherein said water-based solution is selected from the group consisting if isopropyl alcohol and deionized (DI) water, acetone and DI-water, methyl alcohol and DI-water, ethyl alcohol and DI-water, and acetic acid and DI-water;

after said rinsing step, electrochemically depositing a copper layer on said seed layer; and chemically-mechanically polishing said copper layer to form said copper interconnect in said trench.

12. The method of claim 11, wherein said rinsing step occurs in a plating cell of an ECD tool and has a duration in the range of –5 seconds.

13. The method of claim 11, wherein said rinsing step occurs in a cell separate from a plating cell of an ECD tool and has a duration in the range of 1–15 seconds.

14. The method of claim 11, wherein said rinsing step occurs in a tool separate from an ECD tool used to deposit said copper layer and has a duration in the range of 1–15 seconds.

15. The method of claim 11, further comprising the step of spin-drying said seed layer after said rinsing step.

16. The method of claim 11, wherein said water-based solution comprises de-ionized water.

17. The method of claim 11, further comprising the step of drying said seed layer with $N_2$ after said rinsing step.

* * * * *